US008269210B2

(12) United States Patent
Cheng et al.

(10) Patent No.: US 8,269,210 B2
(45) Date of Patent: Sep. 18, 2012

(54) CATHODE ASSEMBLY CONTAINING AN ULTRAVIOLET LIGHT-BLOCKING DIELECTRIC LAYER

(75) Inventors: Lap-Tak Andrew Cheng, Newark, DE (US); Adam Fennimore, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 205 days.

(21) Appl. No.: 12/744,509

(22) PCT Filed: Nov. 26, 2008

(86) PCT No.: PCT/US2008/084778

§ 371 (c)(1), (2), (4) Date: May 25, 2010

(87) PCT Pub. No.: WO2009/070632

PCT Pub. Date: Jun. 4, 2009

(65) Prior Publication Data

US 2010/0252804 A1 Oct. 7, 2010

Related U.S. Application Data

(60) Provisional application No. 60/990,056, filed on Nov. 26, 2007.

(51) Int. Cl.
*H01L 29/06* (2006.01)

(52) U.S. Cl. ........... 257/10; 257/E29.166; 257/E21.211; 438/20

(58) Field of Classification Search .................... 257/10, 257/E29.166, E21.211; 438/20
See application file for complete search history.

(56) References Cited

U.S. PATENT DOCUMENTS

2002/0074932 A1 6/2002 Bouchard et al.
2003/0141495 A1 7/2003 Lee et al.
2005/0258739 A1 11/2005 Park et al.
2006/0028111 A1 * 2/2006 Park et al. .................... 313/311

* cited by examiner

*Primary Examiner* — Bradley K Smith
*Assistant Examiner* — Jami M Valentine

(57) ABSTRACT

A field emission cathode assembly that has a UV-blocking, insulating dielectric layer (3.4).

12 Claims, 14 Drawing Sheets

6A
6B
6C
6D
6E
6F
6G
6.1
6.2
6.3
6.4
6.5
6.6
6.7
6.8
6.9
6.10
6.11
6.12
6.13
6.14
6.15

CATHODE ASSEMBLY CONTAINING AN ULTRAVIOLET LIGHT-BLOCKING DIELECTRIC LAYER

This application claims priority under 35 U.S.C. §119(e) from, and claims the benefit of, U.S. Provisional Application No. 60/990,056, filed Nov. 26, 2007, which is by this reference incorporated in its entirety as a part hereof for all purposes.

TECHNICAL FIELD

This invention relates to a field emission triode device that has a top-gate design.

BACKGROUND

Field emission triode devices have conventionally employed what is often referred to as a "top-gate" or "normal-gate" design, in which in the cathode assembly the gate electrode is located above the electron field emitters, and thus between the cathode electrode itself and the surface of the anode electrode. Within the cathode assembly, the gate and cathode electrodes are electrically isolated with a dielectric insulator layer. As low threshold electron emitting materials such as carbon nanotubes (CNTs) became widely available, such top gate designs in a triode device have become increasingly more attractive for color displays and back light unit applications. Devices with attractive field emission performance have been fabricated using relatively inexpensive thick film process techniques and thick film dielectric and emitter materials.

U.S. Ser. No. 03/141,495 (Lee) and U.S. Ser. No. 05/258,739 (Park) describe top-gate field emission triode devices and methods of fabrication using photoimageable emitting materials and internal thin film UV masks consisting of either metal or amorphous silicon, which must be patterned by costly lithographic steps. Lee discusses extensively the difficulties of avoiding alignment errors when fabricating the cathode assembly for such top-gate triodes due to thermal shrinkage of the substrate between high temperature firing and sequential lithographic patterning steps. He also describes the use of a sacrificial layer in order to avoid residues of emitting material on gate electrode edges caused by an inadequate UV blocking property of the thin film silicon mask layer. Patterning of this sacrificial layer requires an additional lithographic patterning step and is subject to similar alignment error and high cost.

Lee also discloses methods of fabrication of a cathode assembly for such a top-gate triode device using high precision lithographic techniques to achieve accurate alignment of gate and emitter features relative to the center of a via etched in the dielectric layer.

Despite the initial success in device demonstrations, low-cost, high-yield and large-scale fabrication of the cathode assembly for such devices remains a great challenge. Among various technical difficulties, accurate and clean deposition of electron emitting material into dielectric vias while avoiding electrical short circuits between gate and cathode electrodes prove particularly problematic, especially when very large substrates are used. Lee highlights the difficulty of using an internal thin film photomask due to an alignment error caused by substrate shrinkage during firing steps which must take place between lithographic steps for patterning the internal mask, gate holes, dielectric vias, and a sacrificial layer. He also discloses gate and cathode short circuit problems caused by emitter residues occurring at the edge of gate electrodes.

Lee also discloses a solution to the alignment error and residue problem by changing the order in which the internal mask layer and dielectric vias are patterned. Unlike in a conventional method where the internal mask layer is deposited and patterned prior to printing, firing and etching of a dielectric layer, Lee teaches the deposition and patterning of the internal mask layer after the fabrication of dielectric vias. A UV absorptive and electrically resistive thin film layer, such as PECVD grown amorphous silicon, is deposited as the mask layer and patterned. As a result, substrate shrinkage in the cathode assembly does not occur since no firing step is needed between the lithographic patterning of the vias and the mask layer. In addition, the mask layer is deposited on top of the gate electrode and covering the side wall and a portion of the via bottom, thus preventing electrical shorts from being formed by emitter residues contacting both the gate and cathode electrodes. To further assure electrical isolation, a positive-working photoresist, or a negative-working dry film photoresist, is used as a sacrificial layer on the gate electrode surface. During removal of this sacrificial layer, any residue of emitting material that is deposited outside of the via is also lifted off.

To implement Lee's method, several lithographic steps must be accurately aligned. The patterning of the thin film mask layer must be in perfect registration with the via pattern on the substrate. The patterning of the sacrificial layer must also be in perfect registration with the patterned via and mask layer. Since there is no firing between these lithographic steps, perfect registration is achievable in principle. However, as the via size becomes smaller in order to achieve higher resolution and field emission performance, and as the substrate size becomes larger in order to produce large format displays or back light units, as well as to produce multiple panels on a single large substrate to reduce cost, perfect alignment of these lithographic steps can only be achieved at great equipment and processing cost. Any temperature fluctuation across the substrate or photomask surfaces can result in unacceptable alignment error, thus reducing panel performance and production yield. The high investment cost of large area alignment equipment represents a heavy investment burden for low cost devices such as back light units for LCD displays.

A need thus remains for alternative methods to fabricate the cathode assembly in a top-gate triode field emission device to provide ease of manufacturing and reduced final device cost.

SUMMARY

In one embodiment, this invention provides a cathode assembly that has a UV-blocking, insulating dielectric layer. In another embodiment, this invention provides a field emission triode that contains such a cathode assembly.

In another embodiment, this invention provides a method of fabricating a cathode assembly by irradiating, through the back side of a substrate of the cathode assembly, electron emitting material that has been deposited through a via formed in a UV-blocking, insulating dielectric layer.

In a further embodiment, this invention provides a cathode assembly apparatus that includes:

a) a cathode electrode disposed on a substrate, b) a UV-blocking, insulating dielectric disposed on the cathode electrode, c) a gate electrode disposed on the dielectric, d) a plurality of vias through the gate electrode and dielectric that expose the cathode electrode, and e) an electron field emitter located in the vias.

In yet another embodiment, this invention provides a method of fabricating a cathode assembly by:

a) coating a substrate with a first layer of conductive material, b) depositing a UV-blocking, insulating dielectric on the first layer of conductive material, c) depositing a second layer of conductive material on the dielectric, d) forming one or more vias through the second layer of conductive material and the dielectric to expose the first layer of conductive material, and e) depositing an electron emitting material in the via(s).

In yet another embodiment, this invention provides a method of fabricating a cathode assembly by a) coating a first side of a UV-transparent substrate with a layer of a UV-transparent conductive material, b) depositing a UV-blocking, insulating dielectric on the conductive layer, c) depositing a top layer of conductive material on the dielectric, d) forming one or more vias through the top layer of conductive material and the dielectric to expose the layer of UV-transparent conductive material, e) depositing photoresist material on the top layer of conductive material and in the via(s), f) irradiating the photoresist material through the substrate, g) developing the photoresist material to form a channel in each via and re-expose the layer of UV-transparent conductive material, h) depositing photoimageable electron emitting material on the photoresist material and in the channel(s) of the via(s), i) irradiating the emitting material through the substrate, and j) removing the photoresist material and uncured emitting material.

The methods and apparatus hereof address the difficulty of accurately depositing field emitter material in a via in a dielectric layer that electrically isolates the cathode and gate electrodes in a top-gate triode by incorporating a UV-blocking material in or as the dielectric layer.

DETAILED DESCRIPTION

This invention provides, in a top-gate field emission triode device, a cathode assembly having a UV-blocking dielectric layer, and methods of fabrication thereof that do not require alignment of sequential lithographic steps. The UV-blocking dielectric layer functions both as an electrically insulating dielectric between the gate and cathode electrodes as well as a self-aligned internal photomask for the photodeposition of photoimageable electron emitting material. In addition, it may also function as a self-aligned internal photomask for photopatterning of a photoresist-based sacrificial layer. By exploiting these self-alignment steps to pattern a sacrificial layer and deposit emitting material, top-gate triode devices can be manufactured inexpensively with high yield without the use of costly mask alignment equipment. The self-alignment strategy also avoids any alignment error due to firing-induced substrate shrinkage, thus allowing the scaling of top-gate triode devices to very large substrate size.

There is thus disclosed herein a cathode assembly for a top-gate triode field emission device, and methods for its fabrication, that eliminate the high cost of achieving perfect registration involving multiple lithographic steps. A cathode assembly of this invention typically contains, in no particular order, a substrate, a cathode electrode, a gate electrode, an electron field emitter, an insulating dielectric layer. An anode assembly as disclosed and used herein typically contains a substrate, an anode electrode and a phosphor layer.

Figure 1:
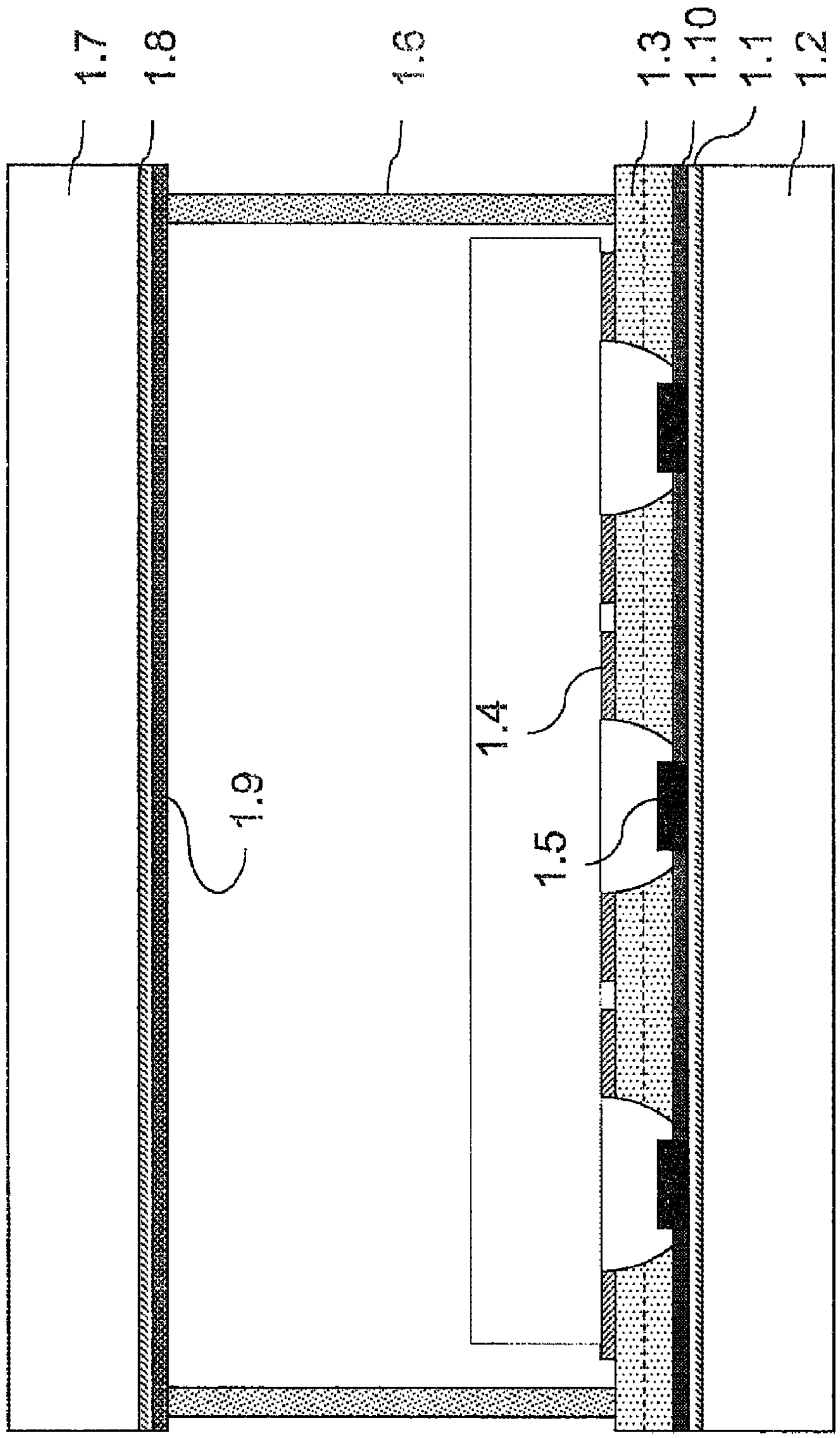
FIG. 1 shows the geometry of a conventional top-gate field emission device equipped with an internal thin film photo mask.

FIG. 1 shows the geometry of a conventional cathode assembly for a top-gate field emission triode device with an internal thin film mask layer. The device contains one or more cathode electrodes 1.1 on a substrate material 1.2. Both the substrate and the cathode electrodes are typically transparent to UV radiation to enable UV exposure of a photoimageable emitting material through the substrate. This type of "back-side" imaging is useful in the deposition of electron emitting material because an internal mask layer 1.10 can be used to define the pattern of the emitting material. The depth of photocuring of the emitting material can be controlled by the UV dose since photocuring starts at the interface of the cathode and the electron field emitting, and gradually progresses into the bulk of the emitting material. In addition to controlling the thickness of the electron field emitter, back-side imaging also provides for good cured adhesion of the emitting material with the cathode electrode since the UV dose at the interface is not diminished by the optical density of the emitter film.

The cathode electrode and internal mask layers are covered by one or more insulating dielectric layers 1.3. For cost effective fabrication, these dielectric layer(s) are typically deposited by sequential screen printing, drying and firing of a thick-film dielectric paste. The dielectric layers are typically fired to a temperature that promotes sintering or melting of the dielectric particles but is held below the softening temperature of the substrate. When using a glass substrate, the dielectric firing temperature is typically between about 500° C. to about 600° C.

On top of the dielectric layer(s) are one or more gate electrodes 1.4 prepared from metal or other types of thin-film conductors. Vias (such as holes or trenches) are typically wet or dry etched through the gate electrode and dielectric layers to expose the cathode electrode at the bottom of each via. An electron emitting material 1.5, which may be or contain for example an acicular material such as carbon nanotubes, is deposited at the bottom of each via to form an electron field emitter, and is in electrical contact with the cathode electrodes.

Located opposite to the cathode assembly and supported by insulating spacers 1.6 is an anode assembly that includes an anode substrate 1.7 containing one or more anode electrodes 1.8. This anode substrate may contain a phosphor coating 1.9 for the emission of light and may be maintained at a constant distance through the use of spacers. Field emission from the electron field emitters is achieved by applying a positive potential to the gate electrodes relative to the cathodes. A separate positive potential applied to the anodes then attracts the emitted electrons to the anode. If a phosphor coating is present on the anode, the electron impacts will create visible light emission.

In the cathode assembly hereof, the function of two of the components of a conventional cathode assembly, the internal mask layer 1.10 and the insulating dielectric layer 1.3, are combined into a single component, which is a UV-blocking dielectric layer. In certain devices, two or more layers of insulating dielectric may be used in such component to insure electrical isolation and maximize break down voltage between the gate and cathode electrodes, and in such devices not all of the dielectric layers may have UV-blocking characteristics. Where such a multi-layer dielectric is used, the optical densities of these layers at the UV wavelength range of the I and G lines may combine to be about 0.5 or greater to mask and absorb UV radiation. The thickness of the UV-blocking dielectric layer may vary from 1 to several tens of microns depending on whether a single- or multi-layer dielectric is used; and, where a multi-layer dielectric is used, depending on the UV absorption coefficients of the dielectric materials used in the UV-blocking layer(s). A single- or multi-layer dielectric having a breakdown strength exceeding 1 kV/mm has suitable strength to electrically isolate the cathode electrode from the gate electrode.

Within the cathode assembly, the position of the UV-blocking dielectric layer may be varied from the top of the cathode stack (immediately adjacent to the gate electrode layer) to the bottom of the cathode stack (immediately adjacent to the cathode electrode layer). Within a multi-layer dielectric, the UV-blocking layer(s) may assume any position (such as top, bottom or middle) in relation to the other layers in the dielectric. Within a particular cathode assembly, different positions for the dielectric layer may enhance the opportunity to optimize one or more of these objectives: electrode isolation; dielectric breakdown voltage; via etching; and emitter deposition that is free, or substantially free, of residue and thus free, or substantially free, of electrical shorts.

Figure 2:
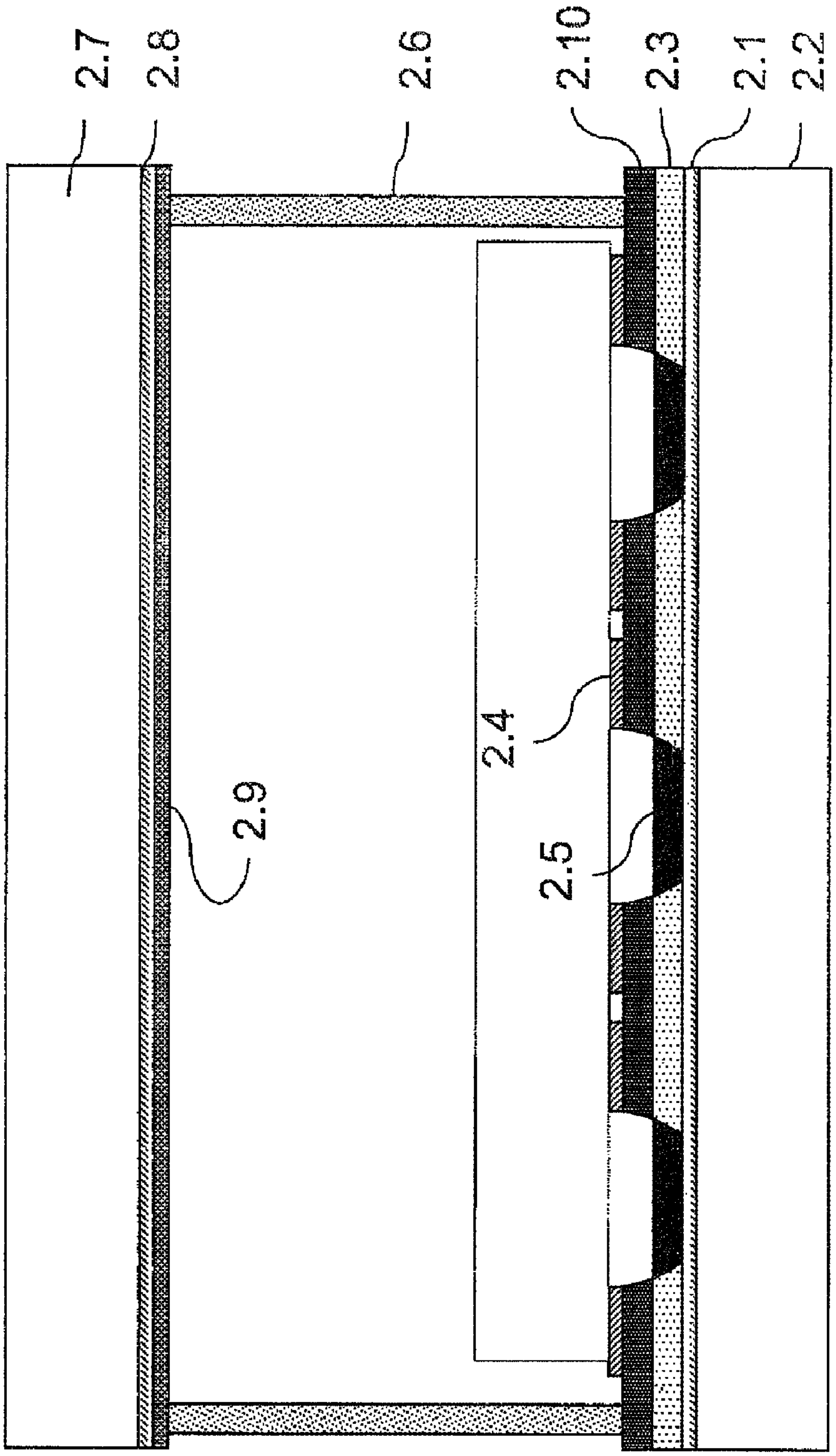
FIG. 2 shows the geometry of a top-gate field emission device as provided herein, which is equipped with a UV blocking dielectric layer.

FIG. 2 shows a side view of a cathode assembly for a top-gate field emission triode device hereof. The cathode assembly contains a cathode electrode layer 2.1 on a substrate material 2.2. Both the substrate and the cathode electrode layer are typically transparent to UV radiation, which allows for back-side UV exposure of photoimageable emitter and resist materials. Disposed on the cathode electrode layer is a single- or multi-layer UV-blocking insulating dielectric. FIG. 2 shows a multi-layer dielectric that has layer 2.3 and layer 2.10, of which layer 2.10 is a UV-blocking layer.

In FIG. 2, the UV-blocking layer 2.10 of the dielectric is located at the top of the dielectric stack, and is immediately adjacent to the gate electrode layer. Disposed upon the dielectric layer 2.10 are one or more gate electrodes 2.4 prepared from metal or other types of thin-film conductors. Vias are typically wet or dry etched through the gate electrode and dielectric layers to expose the cathode electrode layer 2.1 at the bottom of the via. Where possible, it is thus advantageous to select for the various layers in the stack materials that have maximum compatibility of etch rate.

A electron emitting material 2.5, such as an acicular material which is or contains carbon nanotubes, is deposited at the bottom of vias to form an electron field emitter, and is in electrical contact with the cathode electrodes. The deposition of the emitting material is performed by paste deposition or other printing methods as described herein, and is performed in the absence of a mask layer between the cathode layer and the insulating dielectric layer(s), the mask layer being absent from the device. Located opposite to the cathode assembly and supported by insulating spacers 2.6 is an anode assembly containing an anode substrate 2.7 containing one or more anode electrodes 2.8. This anode substrate may contain a phosphor coating 2.9 for the emission of light and may be maintained at a constant distance through the use of spacers.

Materials suitable for use in the preparation of a UV-blocking dielectric layer include without limitation oxides or mixed oxides of one or more of strontium, iron, manganese, vanadium, chromium, cobalt, nickel and/or copper.

Materials suitable for use herein as electron emitting materials to form an electron field emitter include acicular materials such as carbon, diamond-like carbon, a semiconductor, metal or mixtures thereof. As used herein, "acicular" means particles with aspect ratios of 10 or more. Acicular carbon can be of various types. Carbon nanotubes are the preferred acicular carbon and single wall carbon nanotubes are especially preferred. The individual single wall carbon nanotubes are extremely small, typically about 1.5 nm in diameter. The carbon nanotubes are sometimes described as graphite-like, presumably because of the $sp^2$ hybridized carbon. The wall of a carbon nanotube can be envisioned as a cylinder formed by rolling up a graphene sheet. Carbon fibers grown from the catalytic decomposition of carbon-containing gases over small metal particles are also useful as acicular carbon, each of which has graphene platelets arranged at an angle with respect to the fiber axis so that the periphery of the carbon fiber consists essentially of the edges of the graphene platelets. The angle may be an acute angle or 90°. Other examples of acicular carbon are polyacrylonitrile-based (PAN-based) carbon fibers and pitch-based carbon fibers.

The substrate in the cathode assembly or the anode assembly can be any material to which other layers will adhere. Silicon, a glass, a metal or a refractory material such as alumina can serve as the substrate. For display applications, the preferable substrate is glass, and soda lime glass is especially preferred. Materials suitable for use herein in the fabrication of the under-gate electrode, the cathode electrode and/or the anode electrode include without limitation silver, gold, molybdenum, aluminum, oxides of nickel, platinum, tin and tungsten.

An electron field emitter for use in a cathode assembly hereof, and ultimately in a field emission triode device hereof, may be prepared by admixing an electron emitting material with such glass frit, metallic powder or metallic paint (or a mixture thereof) as needed to attach the emitting material to a desired surface. The means of attachment of the electron emitting material must withstand, and maintain its integrity under, the conditions under which a cathode assembly is manufactured and the conditions under with a field emission device containing that cathode assembly are operated. Those conditions typically involve vacuum conditions and temperatures up to about 450° C. As a result, organic materials are not generally applicable for attaching particles to a surface, and the poor adhesion of many inorganic materials to carbon further limits the choice of materials that can be used. A preferred method thus is to screen print a thick film paste containing an electron emitting material and glass frit (such as a lead or bismuth glass frit), metallic powder or metallic paint (or a mixture thereof) onto a surface in the desired pattern, and to then fire the dried patterned paste. For a wider variety of applications, e.g., those requiring finer resolution, the preferred process comprises screen printing a paste that also contains a photoinitiator and a photohardenable monomer, photopatterning the dried paste, and firing the patterned paste.

The paste mixture can be screen printed using well-known screen printing techniques, e.g. by using a 165-400-mesh stainless steel screen. A thick film paste can be deposited as a continuous film or in the form of a desired pattern. When the surface is glass, the paste is then fired at a temperature of about 350° C. to about 550° C., preferably at about 450° C. to about 525° C., for about 10 minutes in nitrogen. Higher firing temperatures can be used with surfaces that can endure them provided the atmosphere is free of oxygen. However, the organic constituents in the paste are effectively volatilized at 350-450° C., leaving the layer of composite comprised of the electron emitting material and glass and/or metallic conductor. If the screen-printed paste is to be photopatterned, the paste may also contain a photoinitiator, a developable binder and a photohardenable monomer comprised, for example, of at least one addition polymerizable ethylenically unsaturated compound having at least one polymerizable ethylenic group.

Beyond the formation of the electron field emitte, formation of other layers or components of a cathode assembly, or formation of the layers or components of an anode assembly, may be achieved by thick film printing methods similar to those set forth above, or by other methods as known in the art such as sputtering or chemical vapor deposition, which may involve the use of masks and photoimagable materials where needed.

Although the deposition of various components of a cathode assembly is described in various places herein as the deposition of a thick or thin film to form a layer, and although various components of a cathode assembly when shown in a side elevation view may appear to be characterized thereby as a layer, the term "layer" as used herein does not necessarily require that a component in a cathode assembly or field emission device be wholly planar or wholly continuous. In terms of shape and layout, a component that is referred to or may be characterized as a layer may in various embodiments be or resemble a strip, line or grid, or an array of discontinuous although electrically connected dots, pads, pegs or posts. A single layer may thus provide a plurality of positions for the location of an element of a cathode electrode, a gate electrode, a charge dissipation layer, an insulating layer and/or an electron field emitter; and an device hereof may thus contain a plurality of each of these kinds of components, which may provide for an array of individually addressable pixels. For example, the cathode electrode and the electron field emitter may be patterned as intersecting lines.

Operation of a field emission triode device hereof involves applying appropriate potentials within ranges that include the voltages used in the examples below, via grounded voltage sources (not shown) external to the device, to a gate electrode and an anode electrode to energize the electron field emitter for the production of filed emission current.

A field emission triode device hereof may be used in a flat panel computer display, in a television, an LCD and in other types of displays, and in vacuum electronic devices, emission gate amplifiers, klystrons and in lighting devices. They are particularly useful in large area flat panel displays, i.e. for displays greater than 30 inches (76 cm) in size. The flat panel displays can be planar or curved. These devices are more particularly described in US 2002/0074932, which is by this reference incorporated in its entirety as a part hereof for all purposes.

Examples

The advantageous attributes and effects of the methods and apparatus hereof may be seen in a series of examples (Examples 1 and 2), as described below. The embodiments of the methods and apparatus on which these examples are based are illustrative only, and the selection of those embodiments to illustrate the invention does not indicate that materials, conditions, components, configurations, steps, techniques or protocols other than as described in these examples are not suitable for practicing these methods and apparatus, or that subject matter other than as described in these examples is excluded from the scope of the appended claims and equivalents thereof. The significance of the examples is better understood by comparing the results obtained therefrom with the results obtained from trials (Controls A and B) that are designed to serve as controlled experiments by providing a basis for such comparison in respect of the absence in the fabrication of the cathode assembly, and thus absence from the device, of a UV-blocking dielectric insulator.

Examples 1 and 2 describe two methods for the deposition of emitting material, direct and lift-off, to fabricate a device of this invention. FIG. 3A shows the top view of the layout of a top-gate cathode assembly (without an electron field emitter) as used in the methods of these examples. Via etching is performed in the same manner for both methods. FIGS. 3B-3J show the processing sequence for via etching. FIGS. 4A-4D show the optical micrographs of a gated dielectric via at different stages of fabrication.

FIGS. 5A-5D depict the processing sequence for the method of Example 1 in which emitting material is deposited directly on the substrate. FIGS. 6A-6G depict the processing sequence for the method of Example 2 in which emitting material is deposited with a lift-off technique involving a sacrificial resist layer. The cathode assembly fabricated in Example 1 contains an insulating dielectric that has one UV-blocking layer, and the cathode assembly fabricated in Example 2 contains an insulating dielectric that has two UV-blocking layers.

In each example, a 2"×2" glass substrate 3.1 was provided, an ITO coating 3.2 was deposited on the substrate, and the coating was etched to form the cathode electrode, as shown in FIG. 3B. For the building of a dielectric stack, a paste of a UV transparent dielectric base material was first prepared. A dielectric paste, which is typically applied as a thick film paste, typically contains a solvent, and organic and inorganic ingredients. The solvent may be a high boiling liquid such as butyl carbitol, butyl carbitol acetate, dibutyl carbitol, dibutyl phthalate, texanol and terpineol. The organic ingredients may include binder polymer, dispersants and/or other rheology modifiers. The inorganic ingredients may include low melting glass frits and other inorganic powders. To prepare the UV-blocking dielectric paste, additional UV-absorbing pigments are added to the base dielectric paste. A high-temperature-stable and glass-chemistry-resistant pigment such as cobalt oxide pigment, at 3% and 5% by weight loading, was used to prepare two UV-blocking dielectric pastes in these examples.

In Example 1, to prepare an insulating dielectric that has one UV-blocking layer, the base dielectric paste was first screen printed on top of the ITO cathode, dried at 125° C. for 5 minutes, and fired in air to a peak temperature of 550° C. for 20 minutes to yield a UV transparent film 3.3 of about 6 μm in thickness 3C. The 5 wt % pigment-containing dielectric paste was then screen printed and fired on top of the base dielectric layer using the same procedure resulting in a 7 μm thick film of a UV-blocking and electrically insulating dielectric material 3.4 as shown in FIG. 3D. A total fired thickness of 13 μm was measured. The UV optical density of the insulating dielectric was measured by placing the dielectric stack between a mercury lamp and an energy meter and a value of greater than 2 was found.

Figure 6:
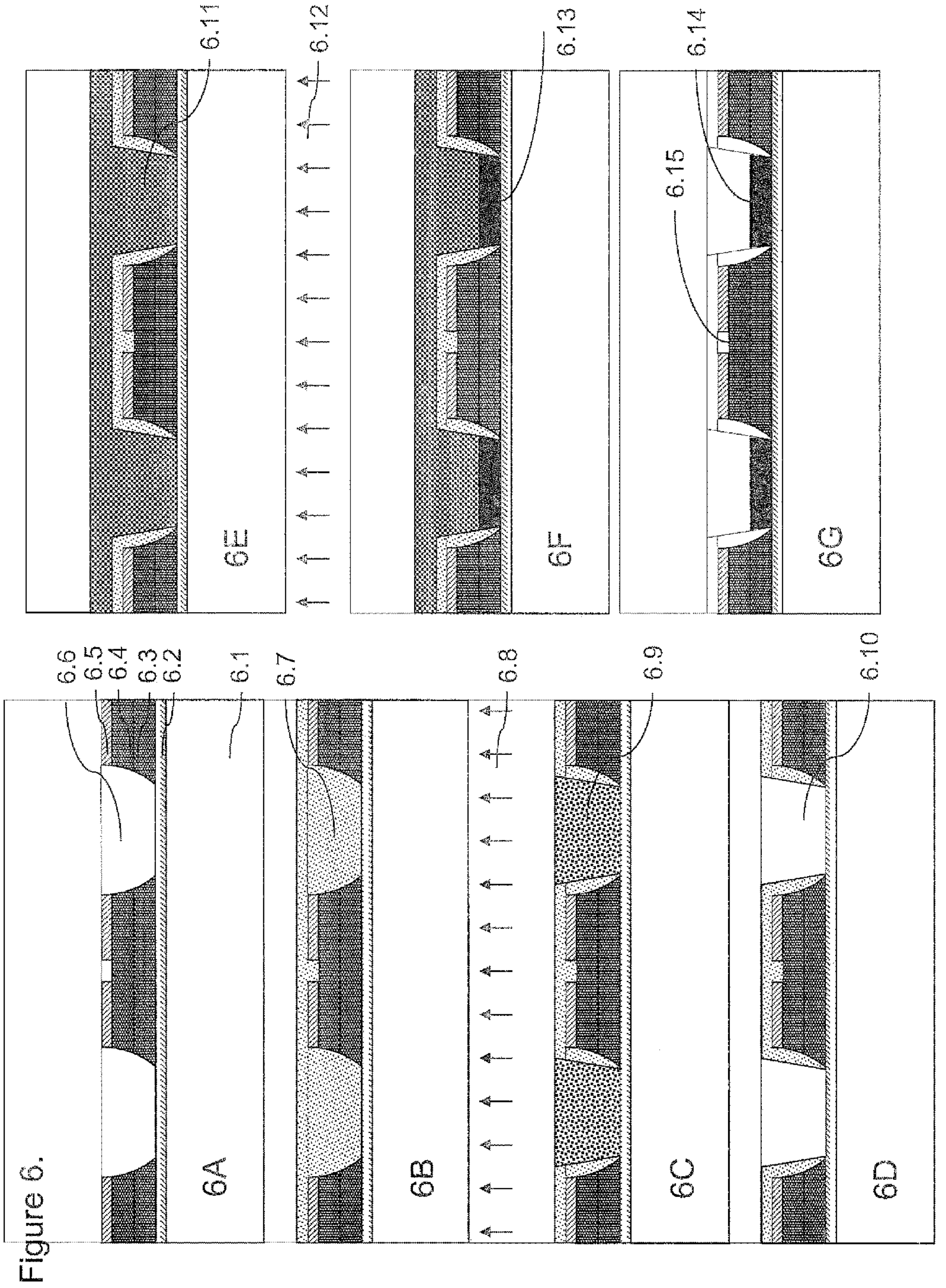
FIG. 6 shows the processing sequence of self-aligned lift-off deposition of emitting material using a double UV blocking dielectric layer.

In Example 2, to prepare an insulating dielectric that has two UV-blocking layers, the 3 wt % pigment-containing containing dielectric paste was printed, dried and fired as described above to form a first layer of UV-blocking dielectric 6.3 on top of the ITO cathode, as shown in FIG. 6. A second 3 wt % pigment UV-blocking dielectric layer 6.4 was then similarly fabricated on top of the first layer as shown in FIG. 6A. A total fired thickness of 13 μm and an optical density greater than 2 were measured for the double layer.

Gate electrodes of 150 nm thick chromium (Cr), 3.5 and 6.5, were then deposited on the dielectric surfaces of the single- and double-layer components described above, using an e-beam evaporator. Direct current voltage breakdown values exceeding 500 V were measured for the 13 μm thick dielectric stacks.

Figure 3:
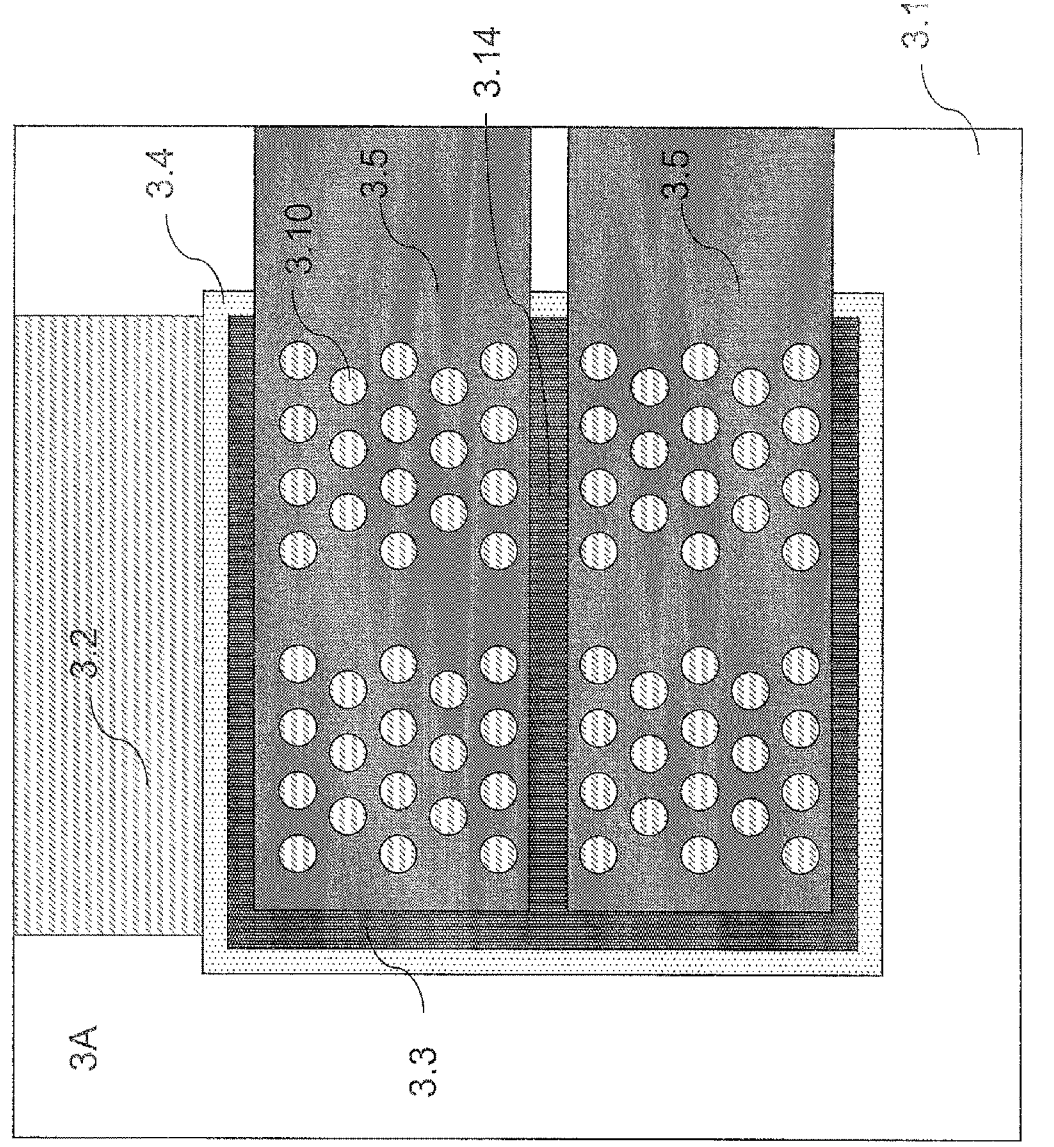
FIG. 3 shows the top view of the layour of a top-gate cathode assembly (without electron field emitter) used in Example 1 and the processing sequence up to via etching.
Figure 3:
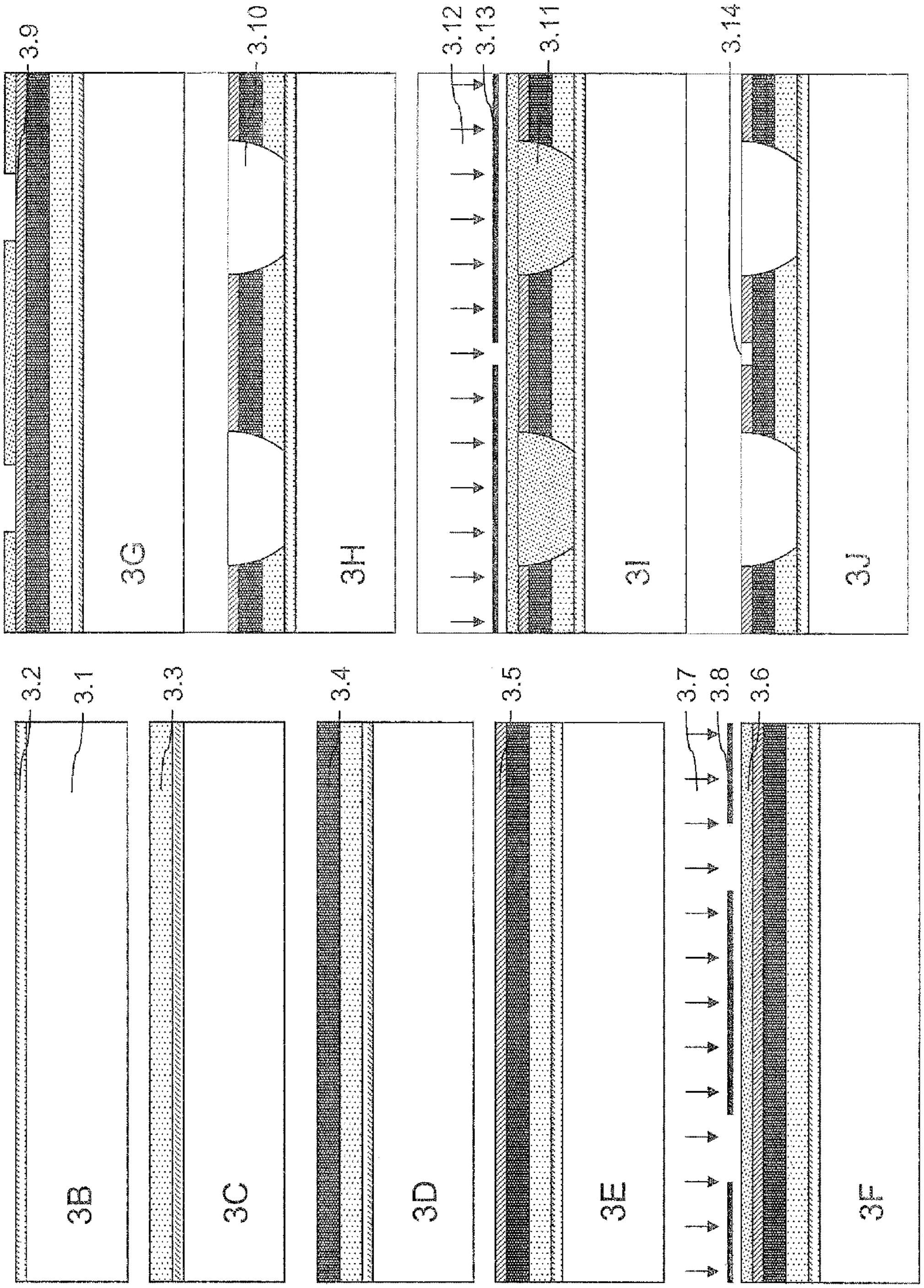
Figure 4:
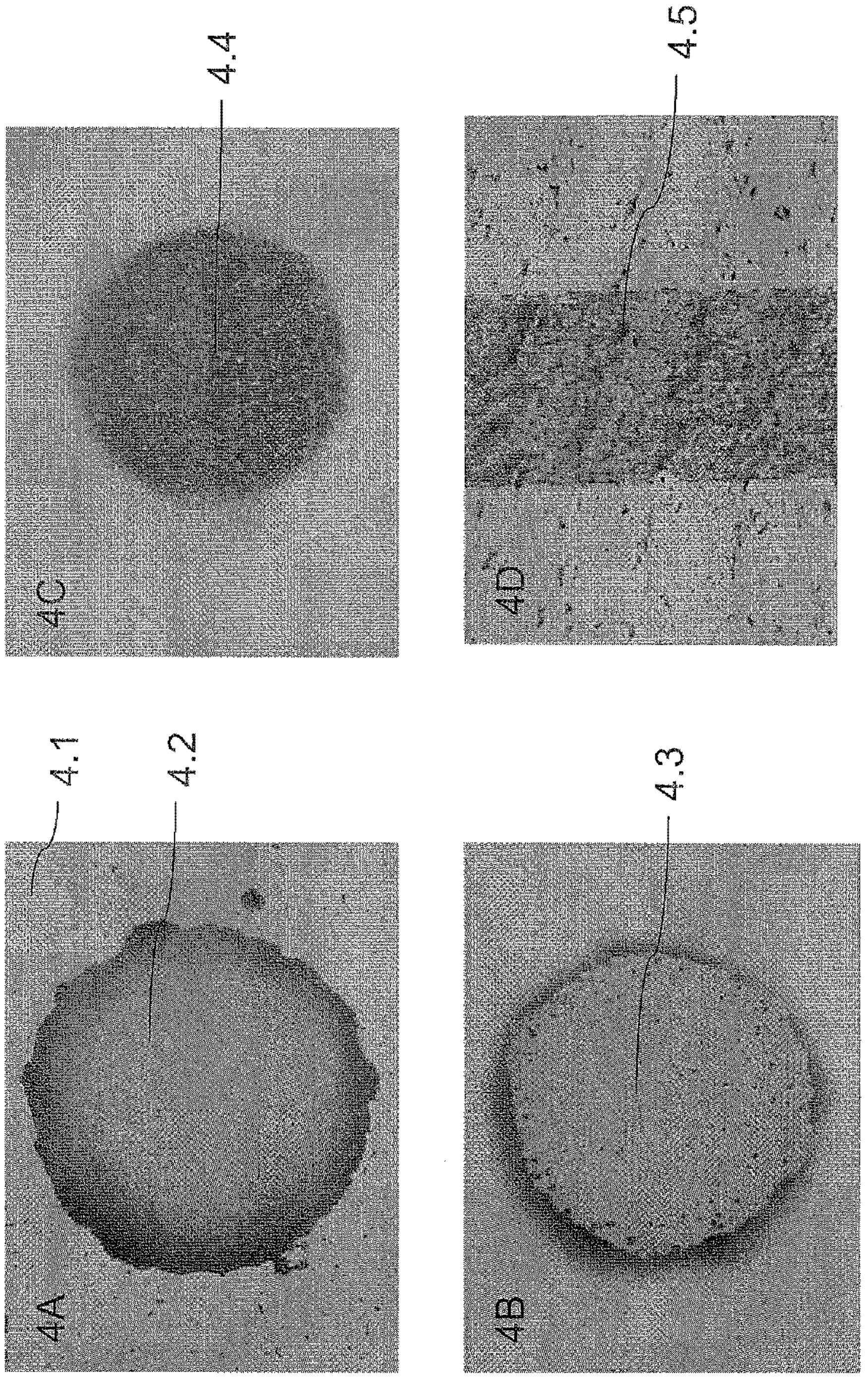
FIG. 4 shows a sequence of optical micrographs for a gated dielectric via at different stages of fabrication.

Conventional lithographic techniques were used to fabricate the via structure in the cathode assembly as shown in FIG. 3. A novolac type photoresist 3.6 (AZ4330 obtained from Clariant Corporation of Sulzbach am Taunus, Germany) was spin coated on the surface of the Cr layer 3.5, as shown in FIG. 3F. A spinning speed of 1500 rpm and a spinning time of 45 seconds was used. The novolac polymer film was dried on a 90° C. hot plate for 2 minutes. A 4 μm thick novolac polymer film was obtained after drying. The photoresist was exposed to UV (350-450 nm) radiation 3.7 through an external photo mask 3.8 patterned with arrays of 20 μm open circles. A UV dose of 300 mJ/cm$^2$ was used. The photoresist was developed in AZ300 MIF developer solution containing 2% tetramethylammonium hydroxide (also obtained from Clariant) for 240 seconds to expose the Cr layer 3.5 as arrays of 20 μm circles 3.9, as shown in FIG. 3G. Post development, the device was baked on a 120° C. hot plate for 3 minutes. The Cr and dielectric stack layers were etched out with wet etchants followed by rinsing in deionized water. Vias 3.10 having a rim diameter of 40-60 μm, depending on etching conditions, were obtained in the Cr and dielectric stack layers, as shown in FIG. 3H. The photoresist layer was then removed with 60° C. PRS2000 resist stripper (obtained from Transene Company of Danvers, Mass., USA). FIG. 4A and FIG. 4B show the Cr gate electrode 4.1, via opening 4.2, and bottom of the via 4.3, respectively.

The surface was then coated again with photoresist 3.11, and a second UV photo-patterning step 3.12 using a different external mask 3.13 was performed to etch out a break in the Cr layer 3.5 in order to define electrically isolated gate lines, as shown in FIG. 3I. The dimension of breaks between gate lines 3.14 created in this second lithographic step was much larger (not shown to scale in FIG. 3), therefore this step was highly tolerant of alignment error. Removal of the photoresist with PRS2000 resist stripper completed performance of the method for formation of vias in the cathode assembly, as shown in FIG. 3J, and the surface was ready for deposition of electron emitting material.

As mentioned above, different methods were used in the two examples to deposit a paste of electron emitting material into the vias of the cathode assembly. In Example 1, the method involved the direct application of paste on the Cr surface of the substrate; and, in Example 2, the method involved first coating the Cr surface with a positive working photoresist that functioned as a sacrificial layer to assist lift-off of paste residue that contains emitting material.

In both methods, a negative working photoimageable paste of electron emitting material for thick film deposition was used. A photoimageable thick film paste typically contains solvent, organic and inorganic ingredients, as well as the electron emitting material. The solvent may be one or mixtures of high boiling liquids such as butyl carbitol, butyl carbitol acetate, dibutyl carbitol, dibutyl phthalate, texanol, or terpineol. The organic ingredients include one or more of a binder polymer, photoactive monomers, initiators, dispersants, and/or other rheology modifiers. The inorganic ingredients may include glass frits, inorganic powders, and/or metallic powders. Electron emitting materials used in the paste may include acicular materials such as carbon nanotubes. To apply the paste to the substrate, conventional screen printing is commonly used. For a photoimageable paste, an un-patterned flood print of the paste is typically used to cover nearly the entire top surface of the device.

Figure 5:
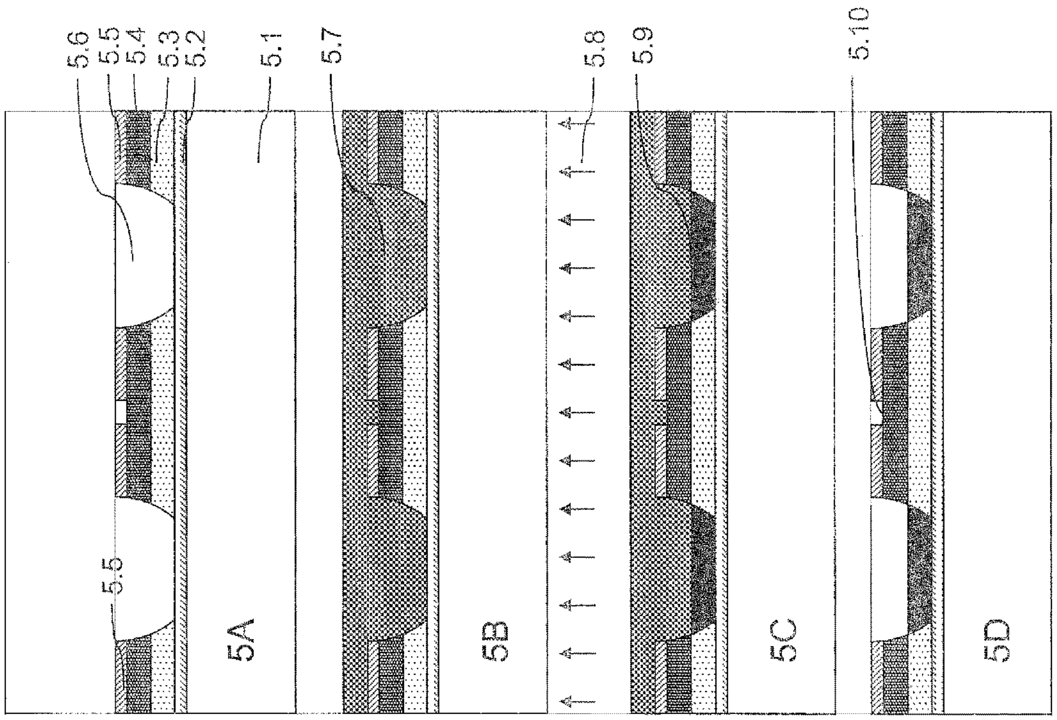
FIG. 5 shows the processing sequence of self-aligned direct deposition of electron emitting material using a single UV blocking dielectric layer.

FIGS. 5A-5D depict the processing sequence for the direct paste deposition method used in Example 1. FIG. 5A shows the top-gate substrate assembly just prior to deposition of the emitting material, which consisted of a glass substrate 5.1, ITO cathode electrode 5.2, base dielectric layer 5.3, UV blocking dielectric material layer 5.4, Cr gate electrodes 5.5, and via openings 5.6. Using a conventional screen printing process, a blanket layer of a photoimageable CNT paste was printed on the substrate, over coating the Cr surface and filling the dielectric vias 5B. The film of CNT paste film was dried in a forced air convection oven at 60° C. for 30 minute. The film of dried CNT paste 5.7 was found to be about 8 μm thick, measured from the Cr surface.

The film of dried CNT paste was exposed to UV radiation 5.8 through the back side of the substrate with an exposure dose of about 100 mJ/cm$^2$. Photocuring of the CNT paste was limited to only the bottom of the dielectric vias by the UV blocking dielectric material layer 5.4. The UV dose determined the thickness of the photocured layer of CNT paste 5.9 at about 4 μm, as shown in FIG. 5C. The film of exposed CNT paste was developed by spraying with a 0.5% $NaCO_3$ aqueous solution for 1 minute during which the uncured CNT paste in the film was washed away leaving behind four arrays of dots of CNT paste 4.4 at the bottom of the vias, as shown in FIGS. 4C and 5D. An area of particular interest was the break 4.5 and 5.10 on the Cr surface between the gate lines. It was determined that this area was completely free of CNT paste residues which could cause electrical shorting between gate lines.

In Example 2, electron emitting material was deposited using the more complicated lift-off method involving a sacrificial layer. This method has the advantage of ensuring residue-free paste deposition. FIGS. 6A-6G depict the processing sequence for the lift-off method of Example 2. FIGS.

7A-7C show optical micrographs of a gated dielectric via at different stages of this fabrication method.

A top-gate cathode assembly, as used in Example 2, just prior to deposition of the paste of emitting material is shown in FIG. 6A. It contained a glass substrate 6.1, ITO cathode electrode 6.2, a first UV-blocking dielectric layer 6.3, a second UV-blocking dielectric layer 6.4, a Cr gate electrode layer 6.5, and vias 6.6. Using a spin coating technique, a positive-working photoresist 6.7 was coated on the surface of the Cr layer, filling all the vias 6B. For larger substrates, slot die coating of the photoresist would be appropriate.

The photoresist film was dried on a hot plate to a thickness of about 3 μm when measured from the Cr surface. The substrate was flood exposed to UV radiation 6.8 through the back side. A UV dose was used such that the photoresist material located directly over the bottoms of the vias was thoroughly exposed through its entire thickness, as depicted at 6.9 in FIG. 6C. In all other areas, however, the photoresist was not exposed to UV radiation due to the presence of the UV-blocking dielectric layer. This self-aligned exposure was carried out without using high cost alignment equipment. Depending on the type of photoresist, a post exposure bake step may be desirable. The exposed photoresist was removed in a developer solution revealing the cathode surface at the bottom of each of the holes in the resist layer 6.10, as shown in FIG. 6D. A post development bake step may also be desirable at this point. FIG. 7A and FIG. 7B show the photoresist covered Cr gate electrode 7.1, the resist hole top opening 7.2, and its bottom 7.3 revealing the ITO cathode respectively.

Using a conventional screen printing process, a blanket layer of a photoimageable CNT paste was printed on the top of the cathode assembly to overcoat the surface and fill all the holes in the resist layer, as shown in FIG. 6E. The photoresist and the emitting material paste selected should not produce any undesirable interactions. The CNT paste was dried in the same manner described above to an 8 μm thick film 6.11, measured from the resist surface. The CNT paste film was exposed to UV radiation 6.12 through the back side of the substrate with an exposure dose of about 100 mJ/cm$^2$. Again, photocuring of the CNT paste was limited to only the bottoms of the resist holes by the UV-blocking dielectric layer. The UV dose determined the thickness of the photocured layer of CNT paste 6.13 at about 4 μm, as shown in FIG. 6F.

Figure 7:
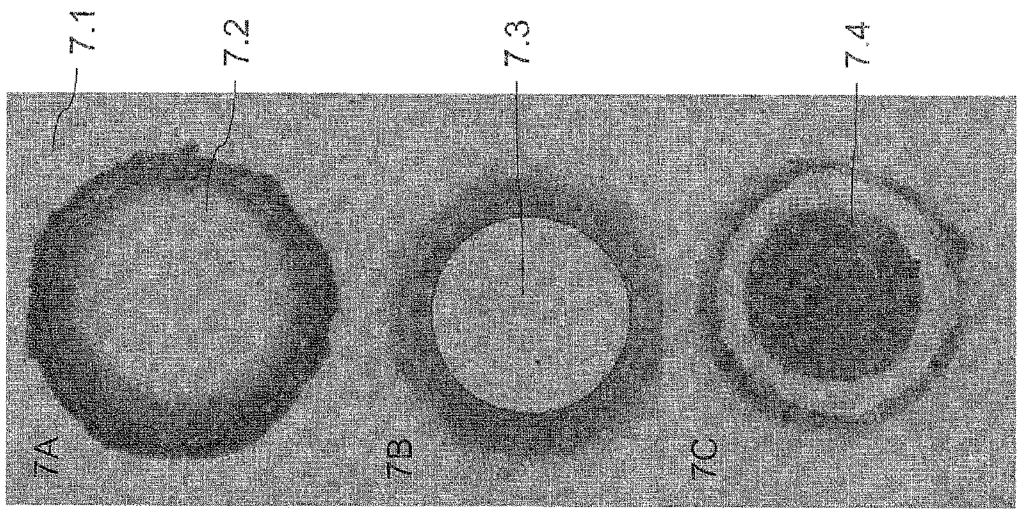
FIG. 7 shows a sequence of optical micrographs for a gated dielectric via at different stages of self-aligned lift-off of deposited emitting material using a sacrificial resist layer.

The film of exposed CNT paste was developed by spraying with a solvent for 1 minute during which the uncured film of the CNT paste and the photoresist layer were washed away, leaving behind four arrays of CNT paste dots at the bottom of the vias, as depicted at 6.14 in FIG. 6G and 7.4 in FIG. 7C. As before, the break 6.15 on the Cr surface between the gate lines was determined to be completely free of CNT paste residues. The use of the UV-blocking dielectric layer and a sacrificial resist assured residue free deposition of the CNT paste without the use of high cost alignment equipment.

Depending on the formulation of the paste of the emitting material, the cathode assembly may require a firing step to eliminate excess organic material in the electron field emitter dots. If so, firing may be carried out in air or under an inert atmosphere to a temperature and for a period of time that minimizes damage to the dots. In Examples 1 and 2, the samples were not fired since firing was not necessary for subsequent emission testing in a vacuum chamber. An activation step was, however, performed in order to achieve improved emission performance. A piece of adhesive tape was laminated over the top of the samples under pressure forcing the adhesive into the vias and contacting the electron field emitter dots. Subsequent peel off of the adhesive tape fractures the emitter dots exposing an "activated" surface of the electron field emitters.

Opposite the activated cathode assembly sample, an anode plate consisting of an ITO coated 2"×2" glass substrate with a phosphor coating was mounted. Spacers 3 mm thick were used to maintain the distance between the cathode and anode substrates. Electrical contact was made to the ITO cathode electrode, Cr gate electrode, and ITO anode electrode using silver paint and copper tape to complete a top-gate triode device. The device was mounted in a vacuum chamber, which was evacuated to a pressure of $<1\times10^{-5}$ Torr. A DC voltage of 1.5 kV was applied to the anode electrode. A pulsed square wave with a repetition rate of 120 Hz and a pulse width of 30 μs was applied to the gate electrode. The cathode electrode was maintained at ground potential.

Figure 8:
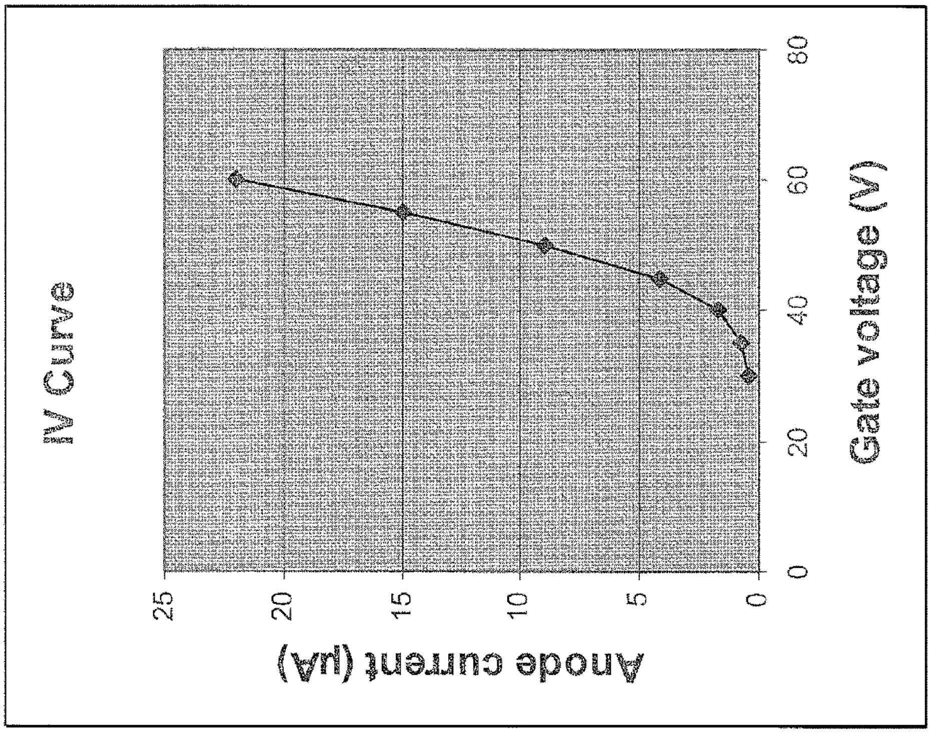
FIG. 8 shows a plot of the anode current and gate voltage values obtained from a top-gate field emission device having a double UV blocking dielectric layer and fabricated by the lift-off method.
Figure 9:
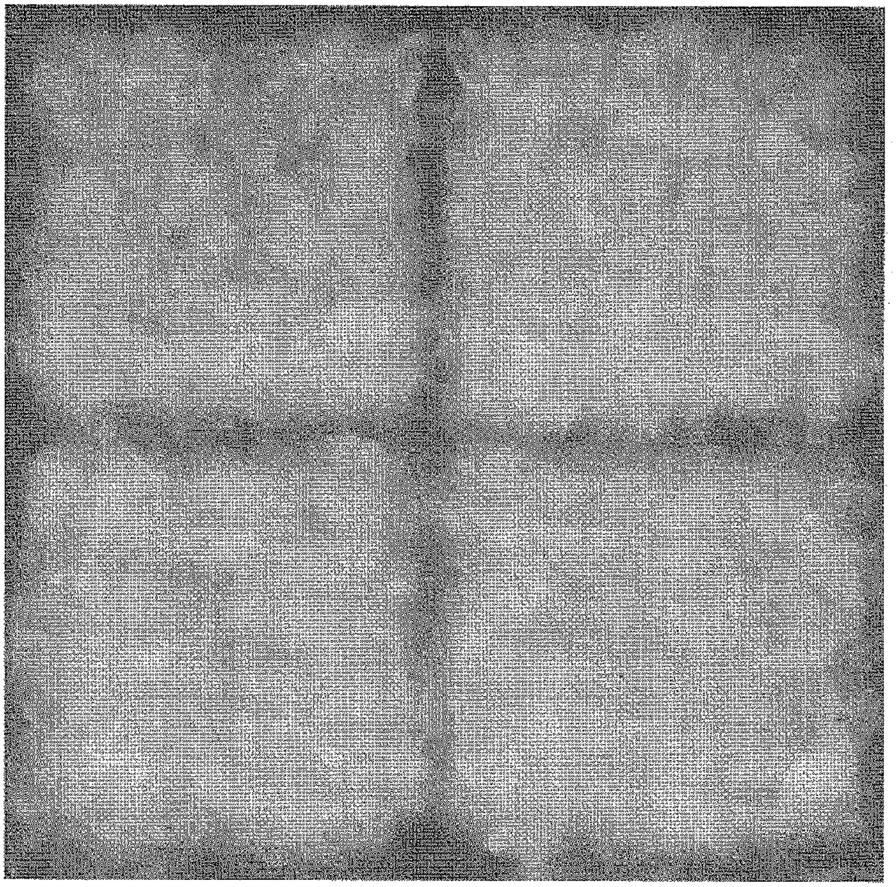
FIG. 9 shows an image of phosphor illumination by electrons emitted by a device having a double UV blocking dielectric layer.

When the pulsed gate voltage reached 30 V, an average anode current of 0.6 μA was measured. As the pulsed gate voltage was increased, increasing anode current was measured. At a gate voltage of 60 V, an anode current of 22.6 μA was obtained. FIG. 8 shows a plot of the recorded anode current and gate voltage values from the top-gate field emission triode device as prepared in Example 2. An image of phosphor illumination by electrons emitted by this device, operating at 1.5 kV anode voltage, 60 V gate voltage, and 22 μA anode current, is shown in FIG. 9. Similar emission results were obtained for the top-gate field emission triode device as prepared in Example 1.

Controls A and B

Figure 10:
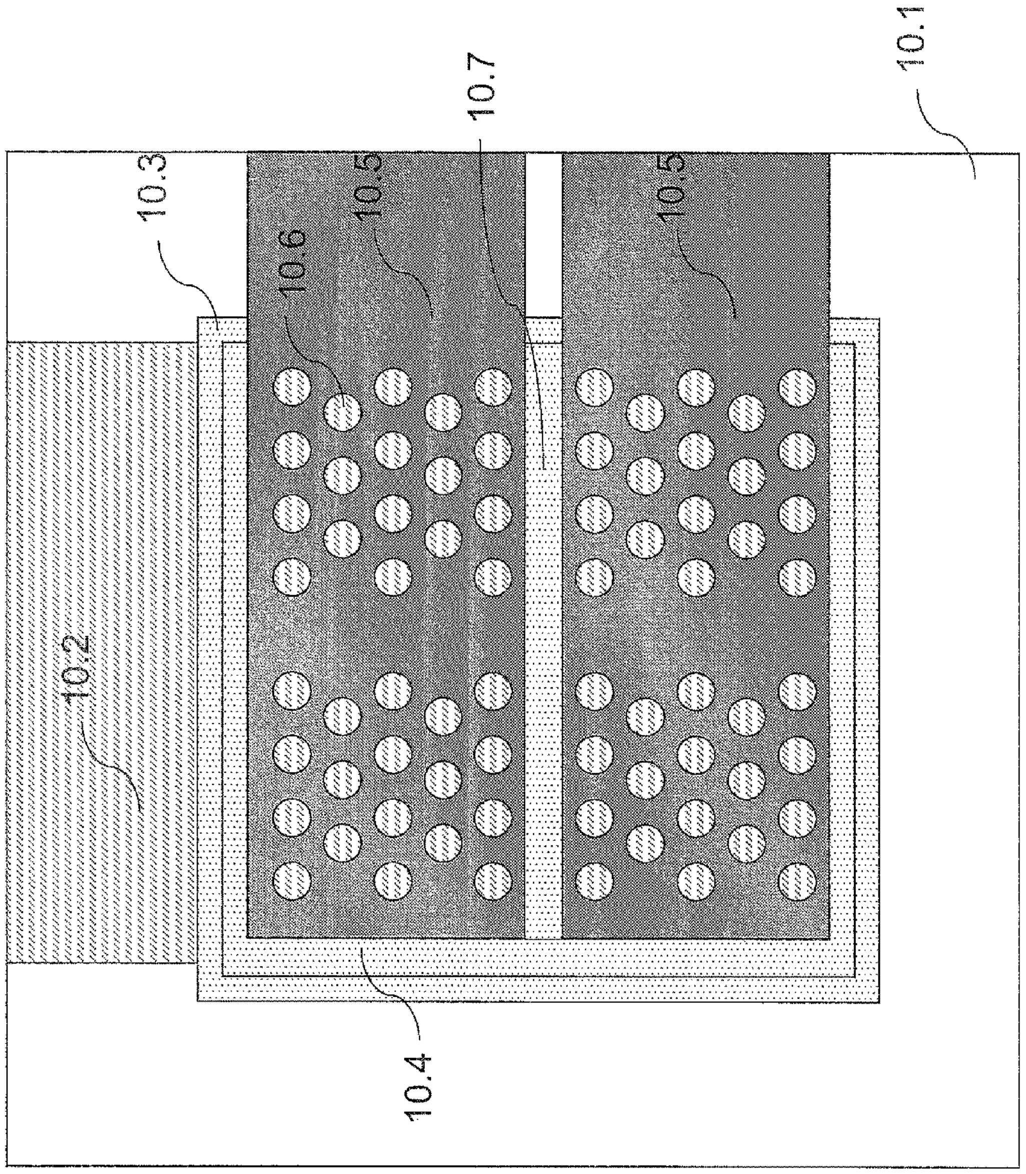
FIG. 10 shows the top view of the layout of a top-gate cathode assembly (without electron field emitter) used in Example 2, which does not have a UV blocking dielectric layer.

Another two samples of cathode assemblies were made with almost identical layout to the samples used in Examples 1 and 2. FIG. 10 shows, as in FIG. 3A, a substrate 10.1, ITO cathode electrode 10.2, first dielectric layer 10.3, second dielectric layer 10.4, Cr gate electrodes 10.5, vias 10.6, and a gap 10.7 between the two gate lines. The processing sequence to fabricate the dielectric vias was also the same as used in Examples 1 and 2, as depicted in FIGS. 3B-3J. The difference between Controls A and B and Examples 1 and 2 is that neither dielectric layer used in Controls A and B had UV-blocking properties.

Figure 11:
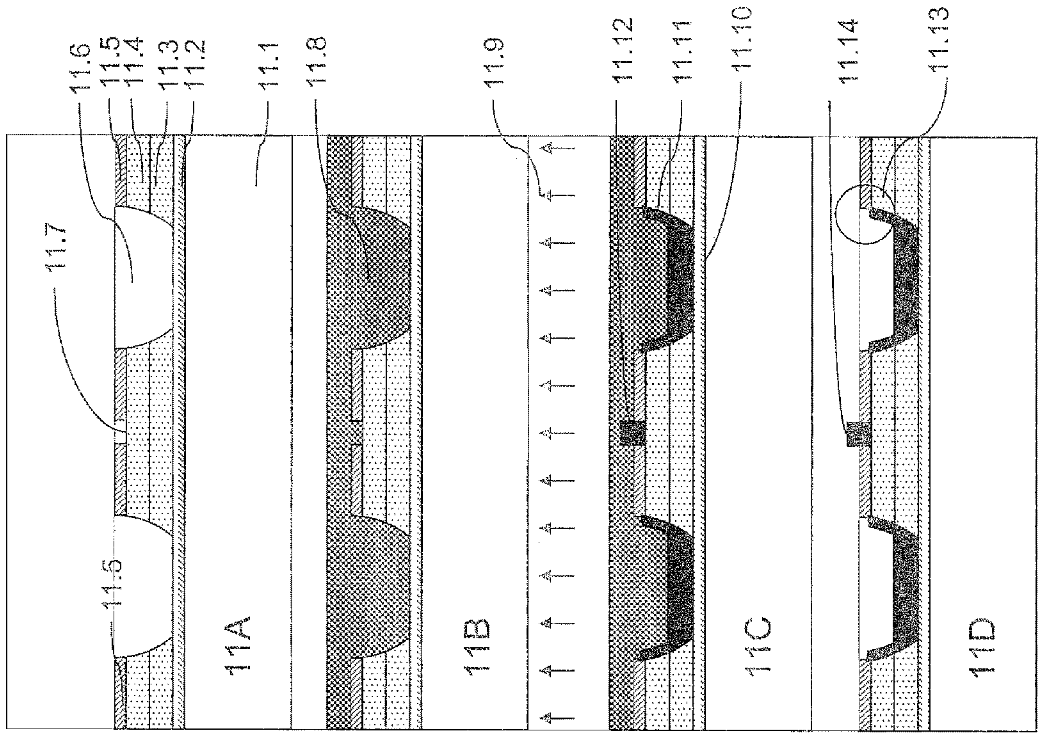
FIG. 11 shows the processing sequence and results of direct deposition of electron emitting material without using a UV blocking dielectric layer.

In Control A, there was direct deposition of a paste of electron emitting material without the use of a sacrificial resist layer. FIGS. 11A-11D show the processing sequence used for Control A. FIG. 11A shows the substrate 11.1, ITO cathode electrode 11.2, first dielectric layer 11.3, second dielectric layer 11.4, Cr gate electrodes 11.5, vias 11.6, and a gap 11.7 between the two gate lines. After printing and drying a photoimageable paste of emitting material 11.8 on the Cr surface and filling all the vias, the sample was exposed to 100 mJ of UV radiation 11.9 through the back side of the substrate. Since UV radiation penetrated through both UV transparent dielectric layers, the paste was photocured at not only the bottom 11.10 but also the side wall 11.11 of the dielectric vias, as well as on the cathode assembly surface at the gap 11.12 between gate lines.

Figure 12:
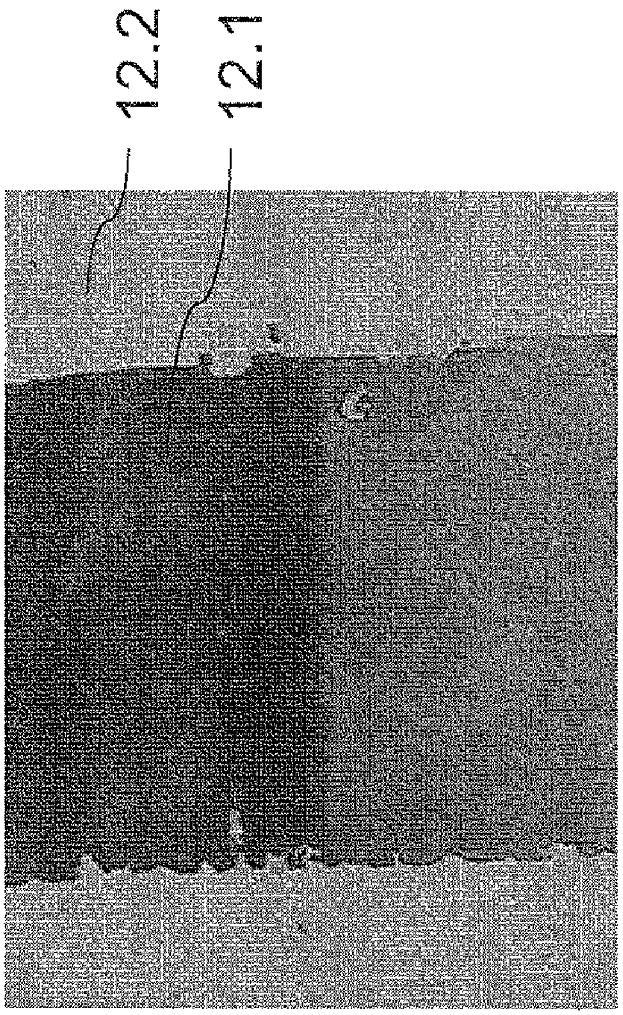
FIG. 12 is an optical micrograph showing the result of deposition of emitting material obtained in Example 2 at the gap between gate lines when the dielectric layer is not UV blocking.

Since the emitting material paste was highly conductive, its proximity to the Cr gate electrode at the via openings 11.13 and at the gap 11.14 between gate lines led to electrical short circuits between the cathode and anode, and between gate lines. FIG. 12 shows photocuring of the electron emitting material 12.1 at the gap between gate lines 12.2 (paste was not printed across all portions of the top of the device). Electrical resistance values of a few hundred ohms were measured between the gate and the cathode, and between gate lines. Such short circuits rendered the triode device inoperable.

In Control B, deposition of a paste of the electron emitting material was performed using a sacrificial resist layer. FIGS.

Figure 13:
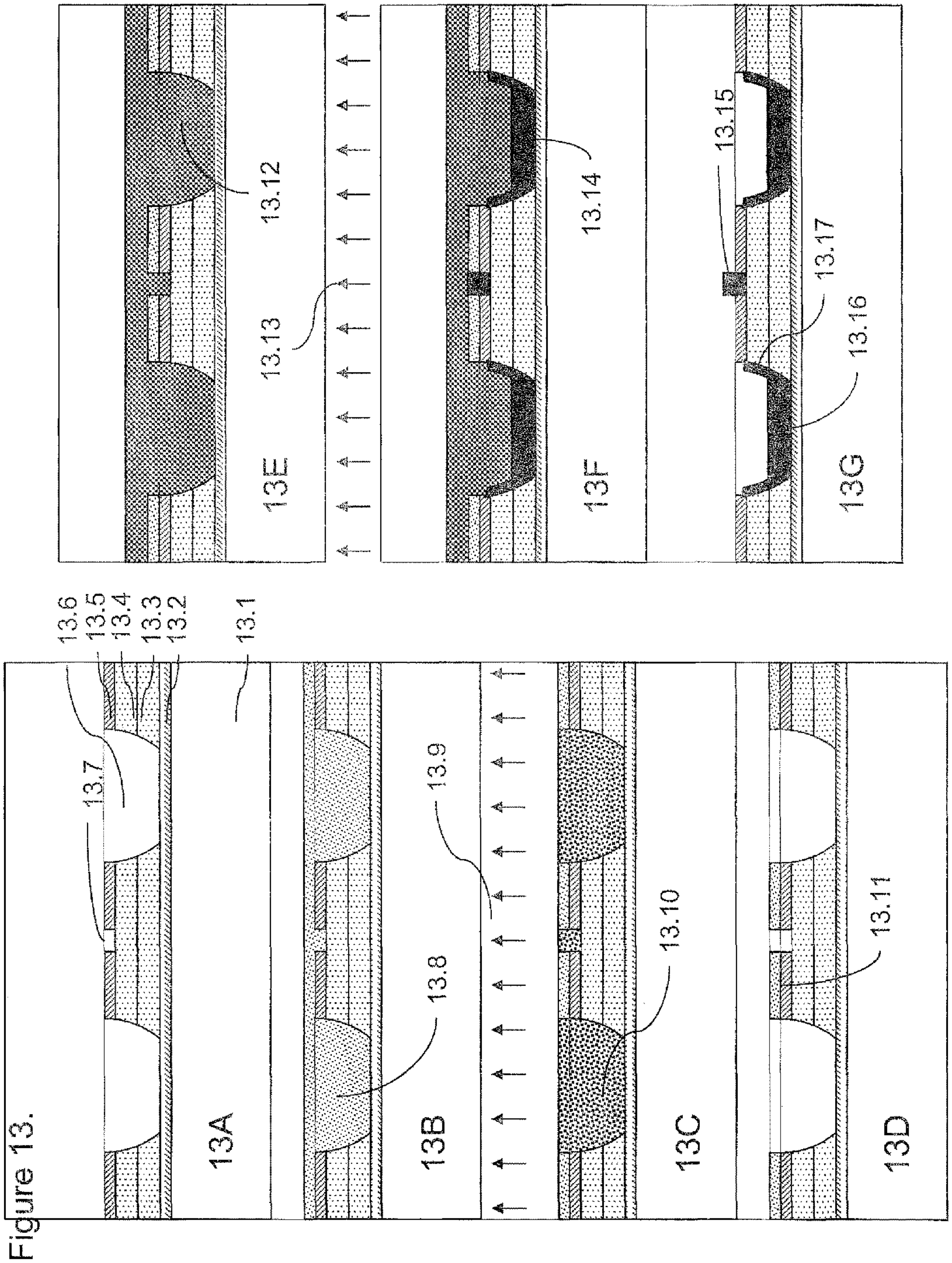
FIG. 13 shows the processing sequence and results of lift-off deposited emitting material using a sacrificial resist layer but not using a UV blocking dielectric layer.

13A-13G show the processing sequence. As before, FIG. 13A shows the substrate 13.1, ITO cathode electrode 13.2, first dielectric layer 13.3, second dielectric layer 13.4, Cr gate electrodes 13.5, vias 13.6, and a gap 13.7 between the two gate lines. A positive-working photoresist 13.8 was spin coated and dried on the surface of the cathode assembly coating the Cr surface and filling all dielectric vias. The substrate was flood exposed to UV radiation 13.9 through the back side. Since both dielectric layers were transparent to UV radiation, only the photoresist that was located directly on top of the Cr gate layer was shielded from UV exposure. All other areas of the photoresist including those within the vias 13.10 was exposed to UV radiation. Resist development removed all resist except in the area directly over the Cr layer as depicted by 13.11 in FIG. 13D. After printing and drying, a photoimageable paste of electron emitting material 13.12 was deposited on the resist surface and filled all the vias. The sample was exposed to 100 mJ of UV radiation 13.13 through the back side of the substrate.

As seen in Control A, UV radiation penetrated through both dielectric layers and caused photocuring of the emitting material paste 13.14. Subsequent development of the emitting material paste and removal of resist resulted in a film of emitting material at the gap 13.15 between gate lines, the bottom 13.16, and side wall 13.17 of the dielectric vias as depicted in FIG. 13G. The proximity of the film of emitting material to the gate layer and its electrical conductivity caused electrical short circuits between the cathode an anode and between gate lines. Such short circuits again rendered the device inoperable.

As high cost alignment equipment was not used in Controls A and B, short circuit free deposition of emitting material could not be achieved without the use of a UV-blocking dielectric layer.

Features of certain of the methods and apparatus of this invention are described herein in the context of one or more specific embodiments that combine various such features together. The scope of the invention is not, however, limited by the description of only certain features within any specific embodiment, and the invention also includes (1) a subcombination of fewer than all of the features of any described embodiment, which subcombination may be characterized by the absence of the features omitted to form the subcombination; (2) each of the features, individually, included within the combination of any described embodiment; and (3) other combinations of features formed by grouping only selected features taken from two or more described embodiments, optionally together with other features as disclosed elsewhere herein.

What is claimed is:

1. A cathode assembly apparatus comprising:

a) a cathode electrode disposed on a substrate;

b) a UV-blocking, insulating dielectric disposed on the cathode electrode, the dielectric comprising an oxide or mixed oxide of one or more metals selected from the group consisting of strontium, iron, manganese, vanadium, chromium, cobalt, nickel, and copper;

c) a gate electrode disposed on the dielectric;

d) a plurality of vias through the gate electrode and dielectric that expose the cathode electrode; and e) an electron field emitter located in the vias.

2. An apparatus according to claim 1 wherein the substrate is transparent to UV radiation.

3. An apparatus according to claim 1 wherein the cathode electrode is transparent to UV radiation.

4. An apparatus according to claim 1 wherein the dielectric comprises cobalt oxide.

5. An apparatus according to claim 1 wherein the optical density of the dielectric at the UV wavelength range of the I and G lines combined is about 0.5 or greater.

6. A device according to claim 1 wherein the cathode electrode and the electron field emitter are patterned as intersecting lines.

7. A device according to claim 1 wherein the electron field emitter comprises carbon nanotubes.

8. A field emission triode device comprising a cathode assembly according to claim 1.

9. A flat panel display, a vacuum electronic device, an emission gate amplifier, a klystron or a lighting device comprising a triode device according to claim 8.

10. A method of fabricating a cathode assembly comprising:

a) coating a substrate with a first layer of conductive material;

b) depositing a UV-blocking, insulating dielectric on the first layer of conductive material, the dielectric comprising an oxide or mixed oxide of one or more metals selected from the group consisting of strontium, iron, manganese, vanadium, chromium, cobalt, nickel, and copper;

c) depositing a second layer of conductive material on the dielectric;

d) forming one or more vias through the second layer of conductive material and the dielectric to expose the first layer of conductive material; and e) depositing an electron emitting material in the via(s).

11. A method according to claim 10 wherein the dielectric comprises cobalt oxide.

12. A method according to claim 10 wherein the optical density of the dielectric at the UV wavelength range of the I and G lines combined is about 0.5 or greater.

* * * * *